United States Patent
Nöbauer et al.

(10) Patent No.: US 12,550,423 B2
(45) Date of Patent: Feb. 10, 2026

(54) TRANSISTOR DEVICE HAVING GROUPS OF TRANSISTOR CELLS WITH DIFFERENT BODY REGION AVERAGE DOPING CONCENTRATIONS AND DIFFERENT SOURCE REGION DENSITIES

(71) Applicant: Infineon Technologies Austria AG, Villach (AT)

(72) Inventors: Gerhard Thomas Nöbauer, Villach (AT); Alessandro Ferrara, Villach (AT); Beatrix Carla Eleonore Leontine Trapp, Villach (AT)

(73) Assignee: Infineon Technologies Austria AG, Villach (AT)

( * ) Notice: Subject to any disclaimer, the term of this patent is extended or adjusted under 35 U.S.C. 154(b) by 448 days.

(21) Appl. No.: 18/320,341

(22) Filed: May 19, 2023

(65) Prior Publication Data

US 2024/0387526 A1    Nov. 21, 2024

(51) Int. Cl.
*H10D 84/83* (2025.01)
*H01L 23/00* (2006.01)
*H01L 23/495* (2006.01)

(52) U.S. Cl.
CPC ............ *H10D 84/83* (2025.01); *H01L 24/05* (2013.01); *H01L 24/37* (2013.01); *H01L 23/49513* (2013.01); *H01L 24/06* (2013.01); *H01L 24/32* (2013.01); *H01L 24/40* (2013.01); *H01L 24/48* (2013.01); *H01L 24/73* (2013.01); *H01L 2224/05552* (2013.01);
(Continued)

(58) Field of Classification Search
CPC .. H10D 62/393; H10D 30/662; H10D 80/251; H10D 62/60; H10D 62/127; H10D 62/126; H10D 12/441; H10D 64/519; H10D 62/155; H01L 24/05; H01L 24/37; H01L 24/40; H01L 2224/401–40265; H01L 2224/404–40499
See application file for complete search history.

(56) References Cited

U.S. PATENT DOCUMENTS

| | | |
|---|---|---|
| 6,503,786 B2 | 1/2003 | Klodzinski |
| 6,924,532 B2 | 8/2005 | Pfirsch et al. |

(Continued)

FOREIGN PATENT DOCUMENTS

CN    115732543 A    3/2023

*Primary Examiner* — Julio J Maldonado
*Assistant Examiner* — Eric Manuel Mulero Flores
(74) *Attorney, Agent, or Firm* — Murphy, Bilak & Homiller, PLLC

(57) ABSTRACT

A transistor device includes: a plurality of transistor cells in a semiconductor substrate; and a source pad above the semiconductor substrate and electrically connected to a source region and a body region of the transistor cells. A first group of the transistor cells has a first body region average doping concentration. A second group of the transistor cells has a second body region average doping concentration higher than the first body region average doping concentration. The transistor cells of the first and second groups are interleaved. The transistor cells have a first source region density in a first area of the semiconductor substrate underneath a region of the source pad designated for clip contacting, and a second source region density lower than the first source region density in a second area of the semiconductor substrate outside the first area.

21 Claims, 4 Drawing Sheets

(52) U.S. Cl.
CPC ............ *H01L 2224/05554* (2013.01); *H01L 2224/0603* (2013.01); *H01L 2224/06051* (2013.01); *H01L 2224/32245* (2013.01); *H01L 2224/37147* (2013.01); *H01L 2224/40245* (2013.01); *H01L 2224/48245* (2013.01); *H01L 2224/73221* (2013.01); *H01L 2224/73263* (2013.01); *H01L 2224/73265* (2013.01)

(56) References Cited

U.S. PATENT DOCUMENTS

| | | |
|---|---|---|
| 7,737,507 B2 | 6/2010 | Brown |
| 9,105,470 B2 | 8/2015 | Noebauer et al. |
| 10,629,595 B2 | 4/2020 | Ouvrard et al. |
| 2015/0380494 A1* | 12/2015 | Furuhashi ............ H10D 12/031 257/77 |
| 2017/0053984 A1 | 2/2017 | Sugawara et al. |
| 2020/0295189 A1 | 9/2020 | Wu et al. |
| 2020/0328276 A1* | 10/2020 | Hoshi ................ H10D 30/669 |
| 2021/0242321 A1 | 8/2021 | Shenoy |

* cited by examiner

TRANSISTOR DEVICE HAVING GROUPS OF TRANSISTOR CELLS WITH DIFFERENT BODY REGION AVERAGE DOPING CONCENTRATIONS AND DIFFERENT SOURCE REGION DENSITIES

BACKGROUND

Linear-mode applications such as active DC-link discharge, battery charge-discharge, inrush current limiters, low-voltage DC motor control, battery hot swap, electronic fuse, etc. use power transistor devices operated within the current saturation region. This mode of operation is commonly referred to as linear operation mode. In linear operation mode, the transistor device channel is saturated with majority charge carriers and the drain current $I_D$ is independent of the drain-to-source voltage $V_{DS}$. Accordingly, the drain current $I_D$ is governed only by the gate-to-source voltage $V_{GS}$ and remains relatively constant for any given $V_{DS}$, thereby exhibiting the behavior of a constant current sink. Conventional power MOSFETs (metal-oxide-semiconductor field-effect transistors) dissipate higher power in linear-mode applications than in switched-mode applications due to simultaneous occurrence of high voltage and current.

The junction temperature of a conventional power MOSFET is not uniform across the entire die (chip). Instead, the temperature of the die tends to be lower where the source pad of the die is contacted by a metallic connector such as a metallic clip, and higher outside the bond pad contact area due to lateral heat flow when operated in linear mode. Die temperature variations can trigger catastrophic failure in linear operation mode, where high power dissipation results in electro-thermal instability when the rate of power generation is higher than the rate of power dissipation. This is visible from the drain current $I_D$ to gate-to-source voltage $V_{GS}$ transfer characteristic which tends to be highly temperature dependent and which causes further instability.

Thus, there is a need for a transistor device with improved linear operation mode performance.

SUMMARY

According to an embodiment of a transistor device, the transistor device comprises: a plurality of transistor cells in a semiconductor substrate; and a source pad above the semiconductor substrate and electrically connected to a source region and a body region of the transistor cells, wherein a first group of the transistor cells has a first body region average doping concentration, wherein a second group of the transistor cells has a second body region average doping concentration higher than the first body region average doping concentration, wherein the transistor cells of the first and second groups are interleaved, wherein the transistor cells have a first source region density in a first area of the semiconductor substrate underneath a region of the source pad designated for clip contacting, and a second source region density lower than the first source region density in a second area of the semiconductor substrate outside the first area.

According to another embodiment of a transistor device, the transistor device comprises: a transistor device formed in a semiconductor substrate; a source pad above the semiconductor substrate and electrically connected to a source region and a body region of the transistor device; and a metallic clip attached to a region of the source pad designated for clip contacting, wherein the body region of the transistor device has interleaved zones of at least two different threshold voltages, wherein the source region of the transistor device has a first density in a first area of the semiconductor substrate underneath the region of the source pad designated for clip contacting, and a second density lower than the first density in a second area of the semiconductor substrate outside the first area.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a transistor device with improved linear operation mode performance. The body region of the transistor device has interleaved zones of at least two different threshold voltages. The source region of the transistor device has a first density underneath the region of the source pad designated for clip contacting and a second density lower than the first density outside the region of the source pad designated for clip contacting and/or around the periphery of the source pad in case of clip misalignment. The interleaved zones of different threshold voltages in combination with the variable density source region ensures the drain current $I_D$ to gate-to-source voltage $V_{DS}$ transfer characteristic is less temperature dependent, which helps to suppress thermal runaway in the linear operation mode.

Described next with reference to the figures are embodiments of the transistor device with improved linear operation mode performance.

Figure 2:
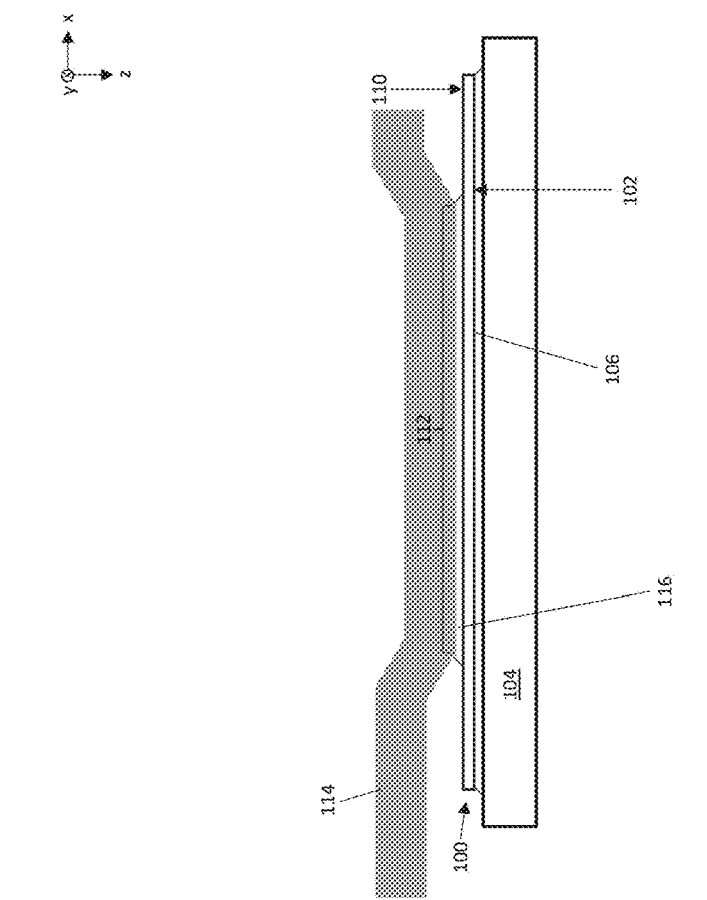
FIG. 2 illustrates a cross-sectional view of the transistor device along the line labelled A-A' in FIG. 1.
Figure 1:
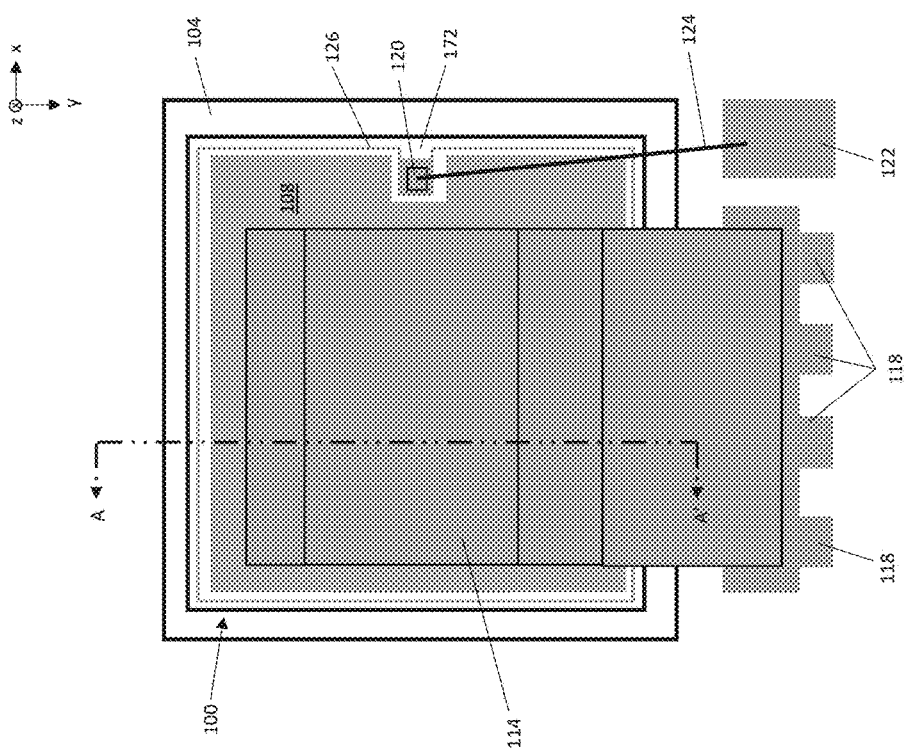
FIG. 1 illustrates a front plan view of a transistor device with interleaved zones of different threshold voltages and variable density source region.

FIG. 1 illustrates a top view of a transistor device 100 for use in applications where linear operation mode is needed such as active DC-link discharge, battery charge-discharge, inrush current limiters, DC motor control, battery hot swap, electronic fuse, etc. FIG. 2 illustrates a cross-sectional view of the transistor device 100 along the line labelled A-A' in FIG. 1.

The backside 102 of the transistor device 100 may be attached to a substrate 104 such as a die pad of a lead frame, a patterned metallization region of a DBC (direct bonded copper), AMB (active metal brazed), or IMS (insulated metal substrate) substrate, a metallic baseplate, etc. For example, a drain terminal at the backside 102 of the transistor device 100 may be attached to the substrate 104 by a joint 106 such as a weld joint, a braze joint, a solder joint, an adhesive joint, etc.

A source pad 108 at the frontside 110 of the transistor device 100 has a region 112 designated for clip contacting. A metallic clip 114 may be attached to the region 112 of the source pad 108 designated for clip contacting, e.g., by a joint 116 such as a weld joint, a braze joint, a solder joint, an adhesive joint, etc. The metallic clip 114 may be a Cu (copper) clip, for example. The part of the metallic clip 114 attached to the source pad 108 may have an area that is at least 10%, 20%, 30%, 40%, 50%, 60%, 70%, 80% or more of the active area of the transistor device 100. The metallic clip 114 may be attached at the opposite end to one or more leads 118. A gate pad 120 at the frontside 110 of the transistor device 100 may be attached to a separate lead 122, e.g., by a bond wire 124. A gate runner 126 may laterally extend from the gate pad 120 to distribute gate potential along the frontside 110 of the transistor device 100.

Figure 4:
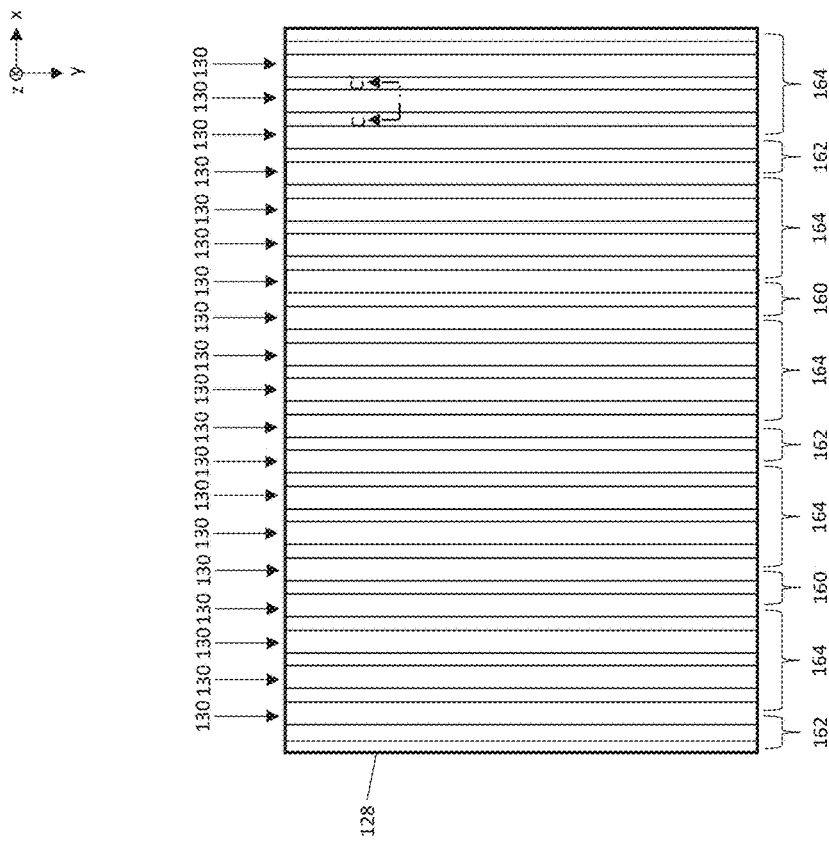
FIG. 4 illustrates a front plan view in a region of the transistor device along the line labelled B-B' in FIG. 3, below the source pad at the surface of a semiconductor substrate in which transistor cells of a transistor are formed.
Figure 3:
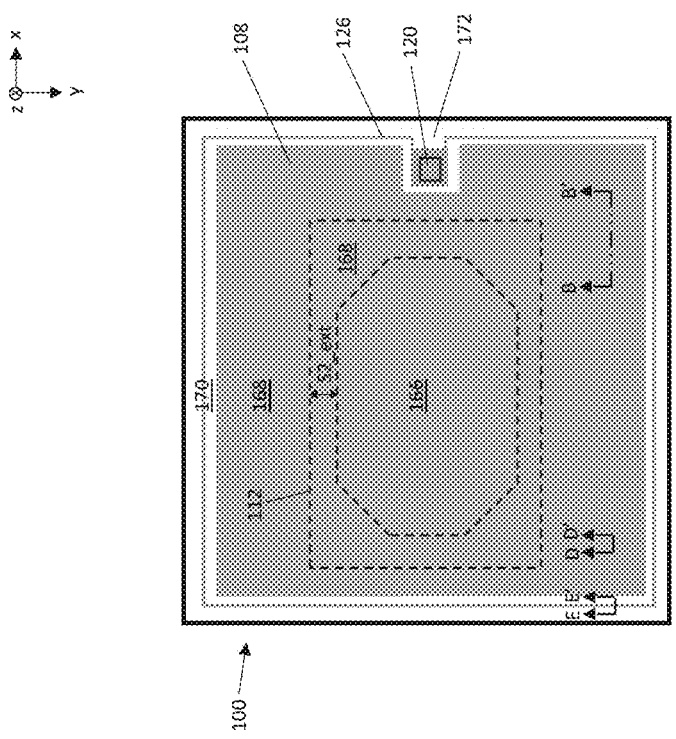
FIG. 3 illustrates a front plan view of the transistor device, without a metallic clip attached to a source pad of the device.
Figure 6:
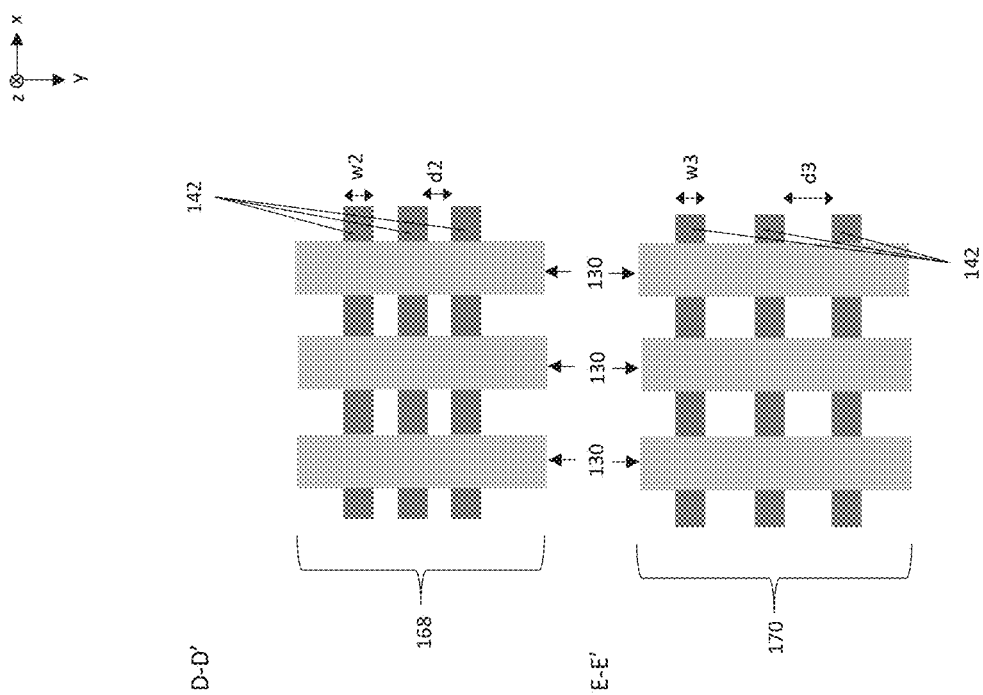
FIG. 6 illustrates a front plan view in two different regions of the transistor device along the lines labelled D-D' and E-E', respectively, in FIG. 3, below the source pad at the surface of the semiconductor substrate.
Figure 5:
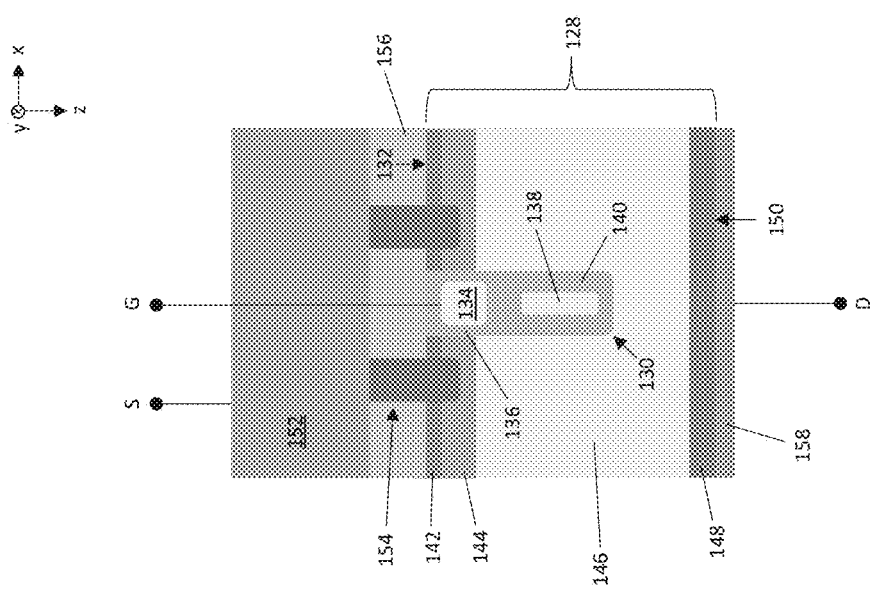
FIG. 5 illustrates a cross-sectional along the line labelled C-C' in FIG. 4, in the region of two adjacent transistor cells.

FIG. 3 illustrates a front plan view of the transistor device 100, without the metallic clip 114 attached to the source pad 108. FIG. 4 illustrates a front plan view in the region of the transistor device 100 along the line labelled B-B' in FIG. 3, below the source pad 108 at the surface of a semiconductor substrate 128 in which transistor cells of a transistor are formed. FIG. 5 illustrates a cross-sectional along the line labelled C-C' in FIG. 4, in the region of two adjacent transistor cells. FIG. 6 illustrates a front plan view in two different regions of the transistor device 100 along the lines labelled D-D' and E-E', respectively, in FIG. 3, below the source pad 108 at the surface of the semiconductor substrate 128.

The transistor device 100 may be a power MOSFET, a JFET (junction FET), an IGBT (insulated gate bipolar transistor), etc., where the transistor cells have the same or similar construction. In general, the transistor device 100 may have tens, hundreds, thousands, or even more transistors cells. The term 'source' as used herein refers to the source of a power FET or the emitter of an IGBT. Likewise, the term 'drain' as used herein refers to the drain of a power FET or the collector of an IGBT.

The semiconductor substrate 128 in which the transistor cells are formed comprises one or more semiconductor materials that are used to form a power transistor such as, e.g., a Si or SiC power MOSFET, a JFET, an IGBT, etc. For example, the semiconductor substrate 128 may comprise Si, silicon carbide (SiC), germanium (Ge), silicon germanium (SiGe), gallium nitride (GaN), gallium arsenide (GaAs), and the like. The semiconductor substrate 128 may include one or more epitaxial layers.

The transistor cells formed in the semiconductor substrate 128 may include gate trench structures 130 formed in a first main surface 132 of the semiconductor substrate 128. The gate trench structures 130 may have a stripe shape. The term 'stripe shape' as used herein means a structure having a longest linear dimension in a direction (y direction in FIGS. 1 through 6) generally perpendicular to the depth-wise direction (z direction in FIGS. 1 through 6) of the semiconductor substrate 128. Each gate trench 130 includes a gate electrode 134 and a gate dielectric 136 between the gate electrode 134 and the sidewall of the gate trench 130. A field plate 138 may be included in each gate trench 130, below the gate electrode 134 and insulated from the gate electrode 134 and adjacent semiconductor material by a field dielectric 140. The field plates 138 may be omitted or formed in different trenches than the gate trench structures 130.

Each transistor cell further includes a source region 142 of a first conductivity type and a body region 144 of a second conductivity type opposite the first conductivity type. The source 142 of each transistor cell is separated from a (common) drift zone 146 of the first conductivity type by the body region 144. In the case of a vertical power transistor, a drain 148 is disposed at the backside 150 of the semiconductor substrate 128.

The first conductivity is n-type and the second conductivity type is p-type for an n-channel device formed by the transistor cells, whereas the first conductivity is p-type and the second conductivity type is n-type for a p-channel device formed by the transistor cells. For either an n-channel device or a p-channel device, the source region 142 and the body region 144 form part of a transistor cell and the transistor cells are electrically connected in parallel between source (S) and drain (D) terminals of the transistor device 100 to form a power transistor.

The body region 144 of the transistor cells may include a body contact region (not shown) of the second conductivity type. The body contact region has a higher doping concentration than the body region 144, to provide an ohmic connection with a source metallization 152 through a contact structure 154 such as electrically conductive vias that extends through an interlayer dielectric 156 separating the source metallization 152 from the semiconductor substrate 128. The source region 142 of the transistor cells are also electrically connected to the source metallization 152 through the contact structure 154. The source pad 108 of the transistor device 100 may be part of the source metallization 152 or formed above the source metallization 152. In either case, the source pad 108 is electrically connected to the source region 142 and the body region 144 of the transistor cells by the source metallization 152 and the contact structure 154.

The gate electrodes 134 of the transistor cells are electrically connected to a gate terminal (G) through, e.g., a gate metallization which is not shown in the figures. The gate pad 120 of the transistor device 100 may be part of the gate metallization or formed above the gate metallization. The gate metallization may be part of a structured power metallization that also includes the source metallization 152. Such a structured power metallization may include a thick power metal layer that comprises Cu, Al, AlCu, AlSiCu, etc., a diffusion barrier and/or adhesion promoter such as Ti and/or TiN and/or W between the thick power metal layer and the interlayer dielectric 156. A drain metallization 158 may be provided at the opposite side 150 of the semiconductor substrate 128 as the source metallization 152.

As shown in FIG. 4, a first group 160 of the transistor cells has a first body region average doping concentration 'Body_Avg1' and a second group 162 of the transistor cells has a second body region average doping concentration 'Body_Avg2' higher than the first body region average doping concentration (i.e., Body_Avg2>Body_Avg1). The transistor cells of the first and second groups 160, 162 are interleaved. The second group 162 of the transistor cells has a higher threshold voltage that the first group 160 of the transistor cells, since Body_Avg2>Body_Avg1. For example, the second group 162 of the transistor cells may have a threshold voltage Vth2 of 2.4V whereas the first group 160 of the transistor cells may have a threshold voltage Vth1 of 1.2V. More generally, the body region 144 of the transistor device 100 has interleaved zones of at least two different threshold voltages to suppress thermal runaway. In one embodiment, the second group 162 of the transistor cells provides a larger area of the body region 144 than the first group 160 of the transistor cells.

A third group 164 of the transistor cells has a third body region average doping concentration 'Body_Avg3' that is higher than the body region average doping concentration of the second group 162 of the transistor (i.e., Body_Avg3>Body_Avg2. The transistor cells of the first, second, and third groups 160, 162, 164 are interleaved. The third group 164 of the transistor cells has a higher threshold voltage Vth3 than the second group 162 of the transistor cells, since Body_Avg3>Body_Avg2. Accordingly, the body region 144 of the transistor device 100 may have interleaved zones of at least three different threshold voltages to suppress thermal runaway. In one embodiment, the third group 164 of the transistor cells provides a larger area of the body region 144 than the second group 162 of the transistor cells and the second group 162 of the transistor cells provides a larger area of the body region 144 than the first group 160 of the transistor cells.

For the case of two threshold voltages only, the second group 162 of the transistor cells may be omitted and the split may be, e.g., 10-90% or 20-80% between the first group 160 of the transistor cells and the third group 164 of the transistor cells. In the case of three threshold voltages, the split may be, e.g., 10-15-75% between the first, second, and third groups 160, 162, 164 of the transistor cells.

The first, second, and third groups 160, 162, 164 of the transistor cells may be formed by performing a baseline body region implant into all of the transistor cells. The baseline body region implant sets the body region average doping concentration Body_Avg1 for the first group 160 of the transistor cells. The first group 160 of the transistor cells is then masked and a second body region implant is performed for all of the unmasked transistor cells. If the second group 162 of the transistor cells is to be provided, both the first and second groups 160, 162 of the transistor cells are then masked and a third body region implant is performed for the remaining unmasked transistor cells. In another embodiment, a baseline body implant is performed for the first group 160 of the transistor cells. If the second group 162 of the transistor cells is provided, a baseline body implant and a first additional implant are performed for the second group 162 of the transistor cells. A baseline body implant and both a first additional and second additional implant are performed for the third group 164 of the transistor cells. Either process may be continued as many times as desired such that the transistor device 100 has two or more groups of transistor cells with different body region average doping concentrations.

Separately or in combination, the transistor cells have a first source region density 'SD1' in a first area 166 of the semiconductor substrate 128 underneath the region 112 of the source pad 108 designated for clip contacting and a second source region density 'SD2' lower than the first source region density (i.e., SD2<SD1) in a second area 168 of the semiconductor substrate 128 outside the first area 166, as shown in FIG. 3. For example, the second area 168 may laterally surround the first area 166 around the periphery of the first area 166. Reducing the source density around the periphery of the first area 166 makes the transistor device 100 more robust against clip misalignment variations. In one embodiment, the first source region density SD1 (the total percentage of the source region 142) is 90% or greater and the second source region density SD2 is less than 90%. If the metallic clip 114 is too small, the second source region density SD2 may be present below the clip 114. For a small clip design, the first area 166 may not present at all. In an embodiment, SD1>=50% and SD2<=90%, with SD2<=SD1.

Less heat is dissipated in the second area 168 with the second source region density SD2 than in the first area 166 with the first source region density SD1, since SD2<SD1. This in turn reduces lateral heat flow between the second area 168 of the semiconductor substrate 128 and the first area 166 of the semiconductor substrate 128, which is beneficial since the metallic clip 114 is in vertical thermal contact with the first area 166 of the semiconductor substrate 128 but not most or all of the second area 168 of the semiconductor substrate 128.

To account for metallic clip placement tolerance, the second area 168 of the semiconductor substrate 128 may laterally extend underneath the region 112 of the source pad 108 designated for clip contacting by a distance 'S2_ext', e.g., of about 250 µm (microns). If the metallic clip 114 is placed within the designated tolerance limit, the entire first area 166 of the semiconductor substrate 128 with the highest source region density (SD1) is assured to be in vertical thermal contact with the metallic clip 114. Some but not all of the second area 168 of the semiconductor substrate 128 may be in vertical thermal contact with the metallic clip 114, depending on the placement position of the metallic clip 114 and whether the second area 168 of the semiconductor substrate 128 laterally extends underneath the region 112 of the source pad 108 designated for clip contacting.

The transistor cells may have a third source region density 'SD3' in a third area 170 of the semiconductor substrate 128 outside the second area 168, where the third source region density SD3 is lower than the second source region density SD2. In one embodiment, the third area 170 with the third source region density SD3 is outside an opening in a passivation layer 172 that adjoins the source pad 108. The second area 168 with the second source region density SD2 is between the edge of the passivation opening and the outer clip edge but may have the lateral extension S2_ext, as explained above. In one embodiment, the first source region density SD1 is 50% or greater, the second source region density SD2 is greater than 33% and less 90%, and the third source region density SD3 is 33% or less, with SD3<=SD2<=SD1. For example, SD1 may be 100%, SD2 may be 50% and SD3 may be 33%.

As shown in the upper half of FIG. 6 for the second area 168 with the second source region density SD2 and in the lower half of FIG. 6 for the third area 170 with the third source region density SD3, the source region 142 of the transistor cells may be segmented into stripes that are spaced apart from one another and run transverse to the stripe-shape gate structures 130 of the transistor cells. For example, in the case of the second source region density SD2 being 50%, the source region stripes in the second area 168 of the semiconductor substrate 128 are spaced apart from one another by a distance 'd2' that corresponds to a width 'w2' of the source region stripes in the second area 168 of the semiconductor substrate 128.

The source region stripes in the third area 170 of the semiconductor substrate 128 may have the same width 'w3' as the source region stripes in the second area 168 of the semiconductor substrate 128. However, since the third area 170 of the semiconductor substrate 128 has a lower source region density than the second area 168 of the semiconductor substrate 128 (i.e., SD3<SD2), the source region stripes in the third area 170 of the semiconductor substrate 128 are spaced apart from one another by a greater distance 'd3' than the source region stripes in the second area 168 of the semiconductor substrate 128. In one embodiment, the distance d3 between the source region stripes in the third area 170 of the semiconductor substrate 128 corresponds to twice the width w3 of the source region stripes in the third area 170 of the semiconductor substrate 128 (i.e., d3=2*w3).

Other types of source region layouts are contemplated to achieve a lower source region density in at least the second area 168 of the semiconductor substrate 128. For example, the source region 142 of the transistor cells may have a checkerboard pattern instead of a stripe pattern in the second area 168 and/or the third area 170 of the semiconductor substrate 128. In another embodiment, the source region 142 of the transistor cells may have a linearly or non-linearly graded density outside the first area 166 of the semiconductor substrate 128 and that increases heading towards the first area 166 of the semiconductor substrate 128. In each case, the source region 142 of the transistor cells has a lower source region density outside the first area 166 of the semiconductor substrate 128 such that each area 168, 170 of the source region 142 that has little or no vertical thermal contact with the metallic clip 114 has lower source region density than the area 166 of the source region 142 that is in vertical thermal contact with the metallic clip 114. The areas 166, 168, 170 of different source region densities may be realized by masked implantation (photolithography), for example.

Figure 7:
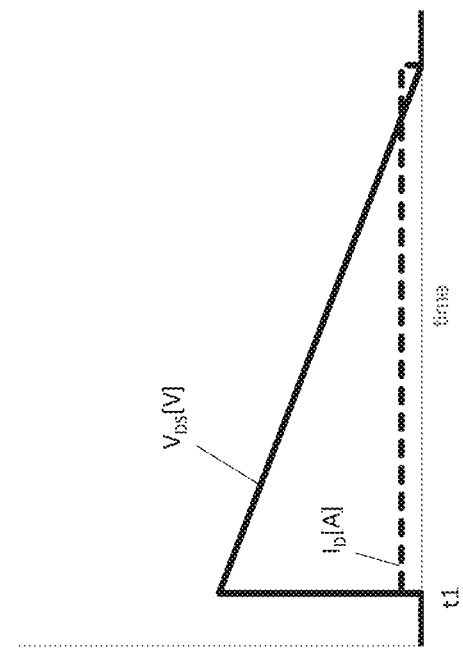
FIG. 7 illustrates a waveform diagram showing the drain current and the drain-to-source voltage of the transistor device in the linear operation mode.

FIG. 7 shows that the interleaved zones of different threshold voltages in combination with the variable density source region ensures the temperature is more uniformly distributed. Also, when a fully charged battery is connected at time t1 to an empty or nearly empty capacitor and the linear device 100 is connected between the battery and a positive terminal of the capacitor, the drain-to-source voltage $V_{DS}$ of the transistor device 100 spikes and then gradually drops but the drain current $I_D$ is independent of the drain-to-source voltage $V_{DS}$ by appropriate regulation of the gate-to-source voltage $V_{GS}$ of the transistor device 100. Such linear mode behavior ensures a controlled charging of the capacitor even though the transistor device 100 operates in the linear operation mode at high $V_{DS}$ during the capacitor charging. Similarly, the transistor device 100 may be operated in the linear mode to disconnect a battery/supply from a load in case of short-circuit or other unexpected load condition.

Figure 8:
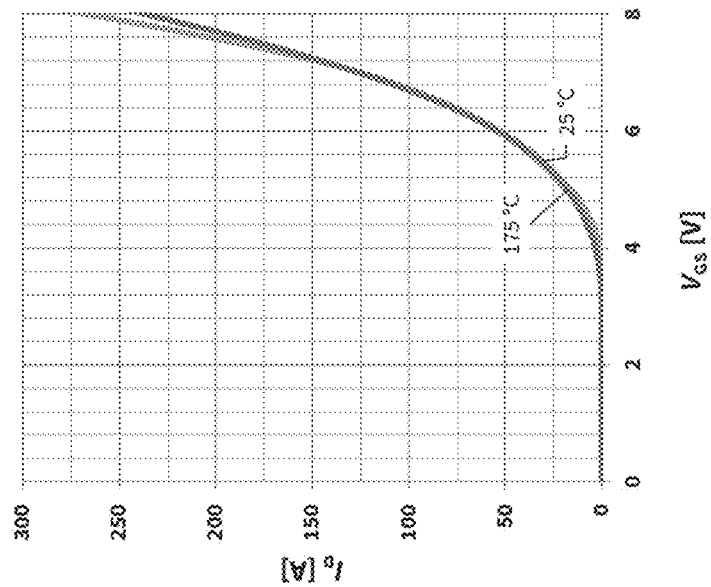
FIG. 8 illustrates a waveform diagram showing the transconductance of the transistor device in the linear operation mode at 25° C. and 175° C.

FIG. 8 shows that the interleaved zones of different threshold voltages in combination with the variable density source region ensures the drain current $I_D$ to gate-to-source voltage $V_{GS}$ transfer characteristic is almost perfectly temperature independent in the linear operation mode, which helps to suppress thermal runaway in the linear operation mode. As shown in FIG. 8, the drain current $I_D$ and transconductance ($\Delta I_D/\Delta V_{GS}$) are almost identical at 25° C. and 175° C. Accordingly, instability that would otherwise occur at higher temperatures and result in higher current and hot spotting is avoided by distributing at least two different threshold voltage regions over the transistor device 100 in the linear operation mode which reduces temperature coefficient ∂I/∂T close to or below zero.

The transistor device 100 with the interleaved zones of different threshold voltages and variable density source region has enhanced linear mode ruggedness (safe operating area) with minimal impact on RDSon (on-state resistance) and maximum junction temperature up to 175° C. or higher, with full turn-on and turn-off control and behavior similar or better than a standard FET. Even at a low transition time, e.g., of 80 ns for turn on at 125 A, no oscillations were observed for a simulation of the transistor device 100. As such, the transistor device 100 is more immune to induced turn on and more linear $V_{DS}$ waveforms were observed compared to a standard FET, yielding lower switching losses. Also, the transistor device 100 has a lower transconductance ($\Delta I_D/\Delta V_{GS}$) which makes the transistor device 100 well-suited for parallelization. Accordingly, the transistor device 100 is particularly well-suited for motor drive applications.

Although the present disclosure is not so limited, the following numbered examples demonstrate one or more aspects of the disclosure.

Example 1. A transistor device, comprising: a plurality of transistor cells in a semiconductor substrate; and a source pad above the semiconductor substrate and electrically connected to a source region and a body region of the transistor cells, wherein a first group of the transistor cells has a first body region average doping concentration, wherein a second group of the transistor cells has a second body region average doping concentration higher than the first body region average doping concentration, wherein the transistor cells of the first and second groups are interleaved, wherein the transistor cells have a first source region density in a first area of the semiconductor substrate underneath a region of the source pad designated for clip contacting, and a second source region density lower than the first source region density in a second area of the semiconductor substrate outside the first area.

Example 2. The transistor device of example 1, wherein the second group of the transistor cells provides a larger area of the body region than the first group of the transistor cells.

Example 3. The transistor device of example 1 or 2, wherein a third group of the transistor cells has a third body region average doping concentration higher than the second body region average doping concentration, and wherein the transistor cells of the first, second and third groups are interleaved.

Example 4. The transistor device of example 3, wherein the third group of the transistor cells provides a larger area of the body region than the second group of the transistor cells, and wherein the second group of the transistor cells provides a larger area of the body region than the first group of the transistor cells.

Example 5. The transistor device of any of examples 1 through 4, wherein the source region of the transistor cells is segmented into stripes in the second area of the semiconductor substrate that are spaced apart from one another and run transverse to stripe-shape gate structures of the transistor cells.

Example 6. The transistor device of example 5, wherein the source region stripes in the second area of the semiconductor substrate are spaced apart from one another by a distance that corresponds to a width of the source region stripes in the second area of the semiconductor substrate.

Example 7. The transistor device of any of examples 1 through 6, wherein the source region of the transistor cells has a graded density outside the first area of the semiconductor substrate and that increases heading towards the first area of the semiconductor substrate.

Example 8. The transistor device of any of examples 1 through 7, wherein the source region of the transistor cells has a checkerboard pattern in the second area of the semiconductor substrate.

Example 9. The transistor device of any of examples 1 through 8, wherein the first source region density is 50% or greater and the second source region density is less than 90%, and wherein with the second source region density is less than or equal to the first source region density.

Example 10. The transistor device of any of examples 1 through 9, wherein the transistor cells have a third source region density in a third area of the semiconductor substrate outside the second area, and wherein the third source region density is lower than the second source region density.

Example 11. The transistor device of example 10, wherein the third area of the semiconductor substrate is outside an opening in a passivation layer that adjoins the source pad.

Example 12. The transistor device of example 10 or 11, wherein the source region of the transistor cells is segmented into stripes in the second area and the third area of the semiconductor substrate that are spaced apart from one another and run transverse to stripe-shape gate structures of the transistor cells.

Example 13. The transistor device of example 12, wherein the source region stripes in the third area of the semiconductor substrate have the same width as the source region stripes in the second area of the semiconductor substrate, and wherein the source region stripes in the third area of the semiconductor substrate are spaced apart from one another by a greater distance than the source region stripes in the second area of the semiconductor substrate.

Example 14. The transistor device of example 12 or 13, wherein the source region stripes in the second area of the semiconductor substrate are spaced apart from one another by a distance that corresponds to a width of the source region stripes in the second area of the semiconductor substrate, and wherein the source region stripes in the third area of the semiconductor substrate are spaced apart from one another by a distance that corresponds to twice a width of the source region stripes in the third area of the semiconductor substrate.

Example 15. The transistor device of any of examples 10 through 14, wherein the first source region density is 50% or greater, the second source region density is greater than 33% and less 90%, and the third source region density is 33% or less, and wherein the third source region density is less than or equal to the second source region density and the second source region density is less than or equal to the first source region density.

Example 16. The transistor device of any of examples 1 through 15, further comprising: a metallic clip attached to the region of the source pad designated for clip contacting.

Example 17. A semiconductor device, comprising: a transistor device formed in a semiconductor substrate; a source pad above the semiconductor substrate and electrically connected to a source region and a body region of the transistor device; and a metallic clip attached to a region of the source pad designated for clip contacting, wherein the body region of the transistor device has interleaved zones of at least two different threshold voltages, wherein the source region of the transistor device has a first density in a first area of the semiconductor substrate underneath the region of the source pad designated for clip contacting, and a second density lower than the first density in a second area of the semiconductor substrate outside the first area.

Example 18. The semiconductor device of example 17, wherein the body region of the transistor device has interleaved zones of at least three different threshold voltages.

Example 19. The semiconductor device of example 17 or 18, wherein the source region of the transistor device has a third density lower than the second density in a third area of the semiconductor substrate outside the second area.

Example 20. The semiconductor device of example 19, wherein the third area of the semiconductor substrate is outside an opening in a passivation layer that adjoins the source pad.

Example 21. A transistor device, comprising: a plurality of transistor cells in a semiconductor substrate; and a source pad above the semiconductor substrate and electrically connected to a source region and a body region of the transistor cells, wherein a first group of the transistor cells has a first body region average doping concentration, wherein a second group of the transistor cells has a second body region average doping concentration higher than the first body region average doping concentration, wherein the transistor cells of the first and second groups are interleaved, wherein the transistor cells have a first source region density in a first area of the semiconductor substrate and a second source region density lower than the first source region density in a second area of the semiconductor substrate outside the first area.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A transistor device, comprising:
a plurality of transistor cells in a semiconductor substrate; and
a source pad above the semiconductor substrate and electrically connected to a source region and a body region of the transistor cells, wherein a first group of the transistor cells has a first body region average doping concentration, wherein a second group of the transistor cells has a second body region average doping concentration higher than the first body region average doping concentration, wherein the transistor cells of the first and second groups are interleaved, wherein the transistor cells have a first source region density in a first area of the semiconductor substrate underneath a region of the source pad designated for clip contacting, and a second source region density lower than the first source region density in a second area of the semiconductor substrate outside the first area.

2. The transistor device of claim 1, wherein the second group of the transistor cells provides a larger area of the body region than the first group of the transistor cells.

3. The transistor device of claim 1, wherein a third group of the transistor cells has a third body region average doping concentration higher than the second body region average doping concentration, and wherein the transistor cells of the first, second and third groups are interleaved.

4. The transistor device of claim 3, wherein the third group of the transistor cells provides a larger area of the body region than the second group of the transistor cells, and wherein the second group of the transistor cells provides a larger area of the body region than the first group of the transistor cells.

5. The transistor device of claim 1, wherein the source region of the transistor cells is segmented into stripes in the second area of the semiconductor substrate that are spaced apart from one another and run transverse to stripe-shape gate structures of the transistor cells.

6. The transistor device of claim 5, wherein the source region stripes in the second area of the semiconductor substrate are spaced apart from one another by a distance that corresponds to a width of the source region stripes in the second area of the semiconductor substrate.

7. The transistor device of claim 1, wherein the source region of the transistor cells has a graded density outside the first area of the semiconductor substrate and that increases heading towards the first area of the semiconductor substrate.

8. The transistor device of claim 1, wherein the source region of the transistor cells has a checkerboard pattern in the second area of the semiconductor substrate.

9. The transistor device of claim 1, wherein the first source region density is 50% or greater and the second source region density is less than 90%, and wherein with the second source region density is less than or equal to the first source region density.

10. The transistor device of claim 1, wherein the transistor cells have a third source region density in a third area of the semiconductor substrate outside the second area, and wherein the third source region density is lower than the second source region density.

11. The transistor device of claim 10, wherein the third area of the semiconductor substrate is outside an opening in a passivation layer that adjoins the source pad.

12. The transistor device of claim 10, wherein the source region of the transistor cells is segmented into stripes in the second area and the third area of the semiconductor substrate that are spaced apart from one another and run transverse to stripe-shape gate structures of the transistor cells.

13. The transistor device of claim 12, wherein the source region stripes in the third area of the semiconductor substrate have the same width as the source region stripes in the second area of the semiconductor substrate, and wherein the source region stripes in the third area of the semiconductor substrate are spaced apart from one another by a greater distance than the source region stripes in the second area of the semiconductor substrate.

14. The transistor device of claim 12, wherein the source region stripes in the second area of the semiconductor substrate are spaced apart from one another by a distance that corresponds to a width of the source region stripes in the second area of the semiconductor substrate, and wherein the source region stripes in the third area of the semiconductor substrate are spaced apart from one another by a distance that corresponds to twice a width of the source region stripes in the third area of the semiconductor substrate.

15. The transistor device of claim 10, wherein the first source region density is 50% or greater, the second source region density is greater than 33% and less 90%, and the third source region density is 33% or less, and wherein the third source region density is less than or equal to the second source region density and the second source region density is less than or equal to the first source region density.

16. The transistor device of claim 1, further comprising:
a metallic clip attached to the region of the source pad designated for clip contacting.

17. A semiconductor device, comprising:
a transistor device formed in a semiconductor substrate;
a source pad above the semiconductor substrate and electrically connected to a source region and a body region of the transistor device; and
a metallic clip attached to a region of the source pad designated for clip contacting,
wherein the body region of the transistor device has interleaved zones of at least two different threshold voltages,
wherein the source region of the transistor device has a first density in a first area of the semiconductor substrate underneath the region of the source pad designated for clip contacting, and a second density lower than the first density in a second area of the semiconductor substrate outside the first area.

18. The semiconductor device of claim 17, wherein the body region of the transistor device has interleaved zones of at least three different threshold voltages.

19. The semiconductor device of claim 17, wherein the source region of the transistor device has a third density lower than the second density in a third area of the semiconductor substrate outside the second area.

20. The semiconductor device of claim 19, wherein the third area of the semiconductor substrate is outside an opening in a passivation layer that adjoins the source pad.

21. A transistor device, comprising:
a plurality of transistor cells in a semiconductor substrate; and
a source pad above the semiconductor substrate and electrically connected to a source region and a body region of the transistor cells,
wherein a first group of the transistor cells has a first body region average doping concentration,
wherein a second group of the transistor cells has a second body region average doping concentration higher than the first body region average doping concentration,
wherein the transistor cells of the first and second groups are interleaved,
wherein the transistor cells have a first source region density in a first area of the semiconductor substrate and a second source region density lower than the first source region density in a second area of the semiconductor substrate outside the first area.

* * * * *